US010366754B2

(12) United States Patent
Matsuoka et al.

(10) Patent No.: US 10,366,754 B2
(45) Date of Patent: *Jul. 30, 2019

(54) SEMICONDUCTOR INTEGRATED CIRCUIT DEVICE WITH REDUCED POWER CONSUMPTION

(71) Applicant: RENESAS ELECTRONICS CORPORATION, Tokyo (JP)

(72) Inventors: Hideto Matsuoka, Tokyo (JP); Masanobu Kishida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 26 days.

This patent is subject to a terminal disclaimer.

(21) Appl. No.: 15/585,682

(22) Filed: May 3, 2017

(65) Prior Publication Data

US 2017/0236585 A1 Aug. 17, 2017

Related U.S. Application Data

(63) Continuation of application No. 14/712,833, filed on May 14, 2015, now Pat. No. 9,672,912.

(30) Foreign Application Priority Data

May 27, 2014 (JP) ................................. 2014-109002

(51) Int. Cl.
*G11C 15/04* (2006.01)
(52) U.S. Cl.
CPC .................................... *G11C 15/04* (2013.01)
(58) Field of Classification Search
CPC ..................................................... G11C 15/04
(Continued)

(56) References Cited

U.S. PATENT DOCUMENTS 6,535,410 B2 *  3/2003  Yanagawa .............. G11C 15/04
                                                    365/203
6,704,216 B1 *  3/2004  Cheng .................... G11C 15/00
                                                    365/189.07

(Continued)

FOREIGN PATENT DOCUMENTS

JP    2002-358791 A    12/2002
JP    2009-110616 A    5/2009

OTHER PUBLICATIONS

Chinese Office Action issued in corresponding Chinese Patent Application No. 201510278624.4, dated Jun. 4, 2018, with English Translation.

(Continued)

*Primary Examiner* — Sung Il Cho
(74) *Attorney, Agent, or Firm* — McDermott Will & Emery LLP

(57) ABSTRACT

A technique for reducing power consumption of a content addressable memory (CAM) system is provided. In a CAM system, an equalizer circuit is coupled to a border portion between a plurality of match line parts generated by dividing each match line corresponding to a piece of entry data, and a precharge circuit precharges each of the match line parts collectively corresponding to a piece of entry data to voltage VDD or VSS. When comparing the entry data and search data, the equalizer circuit couples, in accordance with a control signal, the match line parts after the match line parts are precharged by the precharge circuit. In an equalization period, search operation through the search line is started. A search transistor for comparing search data and entry data includes an NMOS search transistor.

10 Claims, 13 Drawing Sheets

(58) Field of Classification Search
USPC .................................................. 365/49.17
See application file for complete search history.

(56) References Cited

U.S. PATENT DOCUMENTS

| | | | | |
|---|---|---|---|---|
| 7,203,082 B1* | 4/2007 | Bhatia | ................ | G06F 12/0895 |
| | | | | 365/189.07 |
| 8,169,807 B2* | 5/2012 | Dosaka | ................ | G11C 15/04 |
| | | | | 365/49.17 |
| 2003/0161209 A1* | 8/2003 | Gillingham | ............ | G11C 15/04 |
| | | | | 365/227 |
| 2004/0170041 A1* | 9/2004 | Huang | ................ | G11C 15/00 |
| | | | | 711/108 |
| 2006/0193160 A1* | 8/2006 | Hanzawa | ............... | G11C 15/04 |
| | | | | 365/49.15 |
| 2007/0247885 A1* | 10/2007 | Watanabe | ............. | G11C 15/04 |
| | | | | 365/49.17 |
| 2009/0113122 A1* | 4/2009 | Dosaka | ................ | G11C 15/04 |
| | | | | 711/108 |
| 2015/0262667 A1* | 9/2015 | Hebig | ................... | G11C 15/04 |
| | | | | 365/49.17 |

OTHER PUBLICATIONS

Non-Final Office Action issued in related U.S. Appl. No. 14/712,833, dated May 19, 2016.
Final Office Action issued in related U.S. Appl. No. 14/712,833, dated Sep. 27, 2016.
Notice of Allowance issued in related U.S. Appl. No. 14/712,833, dated Feb. 6, 2017.

* cited by examiner

SEMICONDUCTOR INTEGRATED CIRCUIT DEVICE WITH REDUCED POWER CONSUMPTION

CROSS-REFERENCE TO RELATED APPLICATIONS

This application is a continuation of U.S. patent application Ser. No. 14/712,833, filed on May 14, 2015, which in turn claim claims the benefit of Japanese Application No. 2014-109002, filed on May 27, 2014, the disclosures of which Applications are incorporated by reference herein.

BACKGROUND

The present disclosure relates to a semiconductor integrated circuit including a content addressable memory (CAM) and to a technique for reducing power consumption.

In addition to functions for reading and wiring data, a CAM has a search function for searching data stored therein.

To write data to a CAM, the data is transferred to a bit line (BL) and, at the same time, a word line corresponding to the address to which the data is to be written is activated by a row decoder.

In a CAM, searching is made by activating a search line (SL) based on a search data string and determining whether the search data matches entry data in a CAM array. When a matching entry is found by searching, the address of the entry is outputted. An entry stores a data word to be a target of searching and includes plural CAM cells. Each entry is provided with a match line (ML) to which the corresponding CAM cells are coupled in parallel. When a search data string and the data word stored in an entry are compared and are found to match each other, the match line corresponding to the entry is kept at a high level. When, as a result of comparison, it is found that they do not match each other, the corresponding match line is discharged to a low level.

As described, whether the data that matches search data is stored in a CAM can be determined by identifying the potential levels of the match lines.

When, in a CAM, plural entries are found to match search data, the address of one of the entries selected by a priority encoder is outputted.

CAMs like the above-described one are used, for example, for route searching, e.g., as routers and switches, in network devices and for determining a cache miss or hit in a cache memory. For example, a network router includes a CAM used for IP (Internet Protocol) packet routing. The CAM stores IP addresses, and routing is made by comparing an IP address inputted from outside and the IP addresses stored in the CAM. When a match is found as a result of the comparison, data indicating the next destination is written to the IP packet based on the information obtained from the corresponding match line, then the IP packet is sent out.

When search operation is performed in a CAM, all match lines included therein are charged or discharged, so that power consumption of the CAM increases. Also, when the match lines included in a CAM are precharged, it is necessary to reset the search lines to VSS so as to prevent occurrence of a shoot-through current. Namely, every time search operation is performed in a CAM, the search lines are charged/discharged, thereby increasing the power consumption of the CAM. Hence, to reduce the power consumption of the CAM, it is necessary to reduce the power consumption of the search lines and match lines included in the CAM.

SUMMARY

To reduce the power consumption of CAMs and peak currents in CAMs, various techniques are being studied. Techniques concerning CAMs include, for example, those disclosed in Japanese Unexamined Patent Application Publication No. 2009-110616 (patent document 1) and Japanese Unexamined Patent Application Publication No. 2002-358791 (patent document 2).

In both of the embodiments introduced in the patent documents, a CAM system includes a first CAM cell which includes a PMOS (positive channel metal oxide semiconductor) search transistor coupled to a first match line and a second CAM cell which includes an NMOS (negative channel metal oxide semiconductor) search transistor coupled to a second match line. The first and second match lines coupled with the first and second CAM cells, respectively, differ in potential to which they are discharged when a relevant search result is a mismatch. When a search result corresponding to the first CAM cell including the PMOS search transistor is a mismatch, the first match line coupled with the first CAM cell and precharged to an intermediate potential is discharged to a first potential (VDD). Namely, the first match line assumes the first potential (VDD). When a search result corresponding to the second CAM cell including the NMOS search transistor is a mismatch, the second match line coupled with the second CAM cell and precharged to an intermediate potential is discharged to a second potential (VSS). Namely, the second match line assumes the second potential (VSS).

Thus, when a search result is a mismatch, the first match line and the second match line differ in potential. Therefore, the CAM system cannot start search operation until after equalizing the first match line and the second match line to generate an intermediate potential and dividing the match line again. Assume, for example, that, when the first match line and the second match line are being equalized, the search lines are activated by the CAM system. In this case, if the search results on the first match line and the second match line both become mismatches at the same time, the first match line and the second match line are discharged to the first potential (VDD) and the second potential (VSS), respectively, with the two match lines left coupled to each other. This causes short-circuiting between the first potential (VDD) of the first match line and the second potential (GND) of the second match line with the two match lines coupled together via the equalizer circuit.

It is considered that, in a CAM system mainly used to search for specific IP addresses, most search results are mismatches. Therefore, if the CAM system activates the search lines while the first match line and the second match line are being equalized, short-circuiting is highly likely to occur to possibly destroy the chip. It is, therefore, necessary to delay search line activation until the match lines have been equalized and have then been divided. This delays the subsequent sense operation to be performed by the match amplifier and consequently lowers the search operation frequency. Furthermore, PMOS transistors compared with same-sized NMOS transistors are smaller in source-drain current, so that, to be comparable to NMOS transistors in performance, PMOS transistors are required to be larger than NMOS transistors. In the embodiments disclosed in the foregoing patent documents, to make the first CAM cell including a PMOS search transistor and the second CAM cell including an NMOS search transistor operate at a same search operation frequency, it is generally necessary to make the PMOS search transistor larger. This increases the chip area and, hence, the chip cost. Since this also makes it necessary to develop two types of CAM cells, the cost of designing and process development increases.

There is demand that semiconductor integrated circuits including CAMs be made faster in search operation. Hence, techniques are in demand for reducing power consumption and further speeding up search operation in semiconductor integrated circuits including CAMs.

Other objects and novel features of the present invention will become apparent from the following description of the present specification and the accompanying drawings.

A semiconductor integrated circuit according to an embodiment of the present invention has a content addressable memory device. The semiconductor integrated circuit includes a memory cell array, an equalizer circuit, and a precharge circuit. The memory cell array includes a plurality of memory cells each coupled to a search line and a match line and a plurality of match lines coupled to the memory cells. The equalizer circuit is coupled to a border portion between a plurality of match line parts generated by dividing each of the match lines, the each of the match lines corresponding to a piece of entry data. The precharge circuit precharges the match line parts collectively corresponding to a piece of entry data. When comparing the entry data and search data, the precharge circuit precharges each of the match line parts divided by the equalizer circuit to one of at least a first potential and a second potential different from the first potential. When comparing the entry data and the search data, the equalizer circuit couples, in accordance with a control signal, the match line parts after the match line parts are precharged by the precharge circuit.

According to a semiconductor integrated circuit of an embodiment of the present invention, a match line corresponding to a piece of entry data is divided into plural parts and the plural parts are set to an intermediate potential by an equalizer circuit. This only requires one of the divided match line parts to be precharged to a potential higher than that of the other divided match line parts, so that power consumption of the semiconductor integrated circuit can be reduced.

DETAILED DESCRIPTION

Embodiments of the present invention will be described in the following with reference to drawings. In the following description, identical components are denoted by identical reference signs. Since such components have identical names and functions, they will not be repeatedly described in detail.

First Embodiment

A semiconductor integrated circuit according to a first embodiment of the present invention will be described with reference to drawings.

<Configuration>

Figure 1:
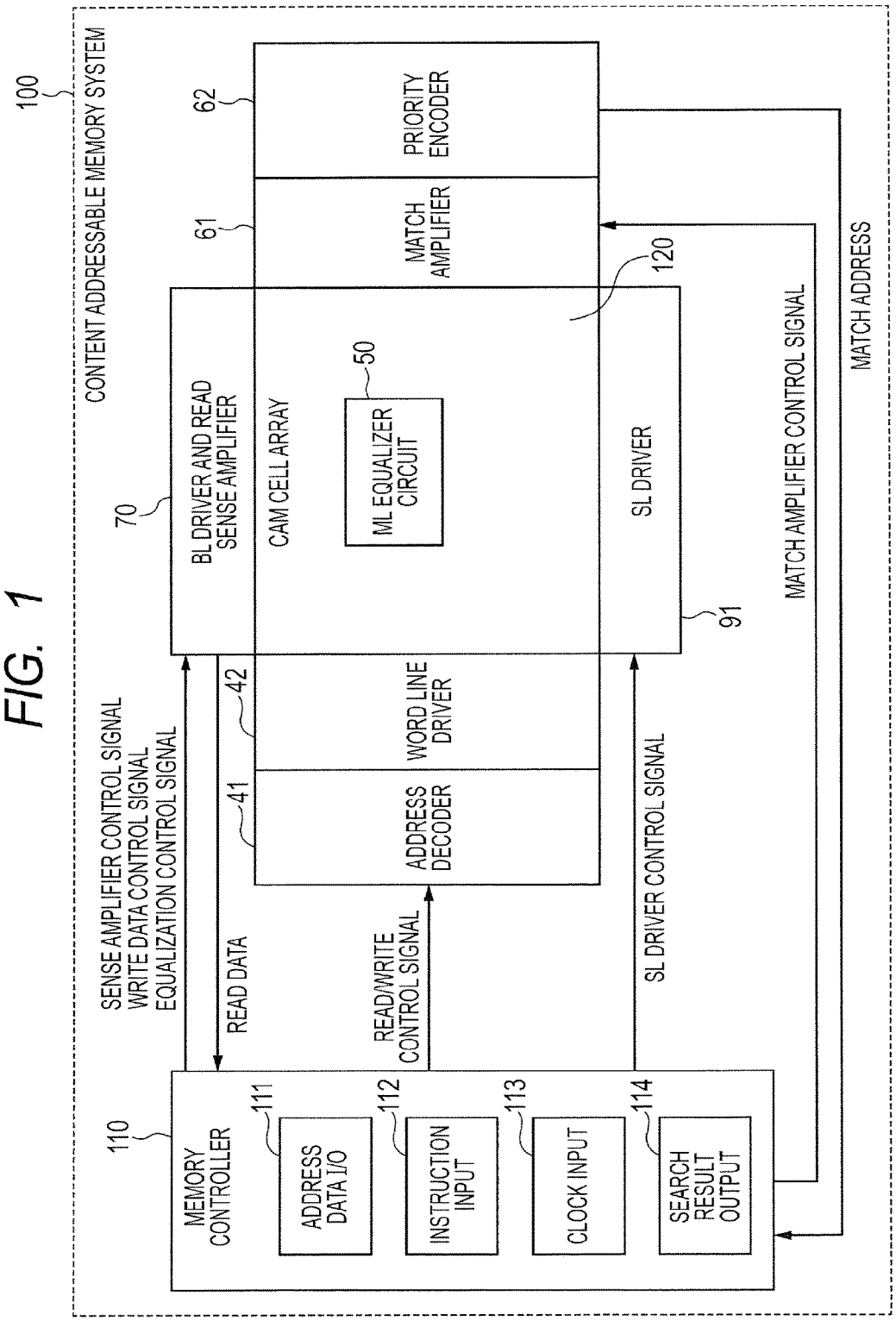
FIG. 1 is a block diagram showing a configuration of a content addressable memory (CAM) system (100) according to a first embodiment of the present invention.

FIG. 1 is a block diagram showing a configuration of a content addressable memory system (hereinafter also referred to as a "CAM system") 100 according to a first embodiment of the present invention.

As shown in FIG. 1, the CAM system 100 includes a CAM cell array 120, an address decoder 41, a word line driver 42, a bit line driver and read sense amplifier 70, a search line driver 91, a match amplifier 61, a priority encoder 62, and a memory controller 110.

The CAM cell array 120 holds plural entries of storage data. Each entry includes plural CAM cells (individual CAM cells are not shown in FIG. 1). Each entry has an address. The CAM cell array 120 accepts search data input and, in parallel for the respective entries, determines whether each entry of storage data matches the search data. The CAM cell array 120 is configured as a ternary CAM. Each CAM cell can assume one of three logical values, i.e. high, low, and don't care (X).

To be concrete, the CAM cell array 120 accepts line-by-line (entry-by-entry) writing of storage data. The bit line driver and read sense amplifier 70, being described later, activates the bit line (BL) based on the data being written to the CAM cell array 120. The word line driver 42, being described later, activates the word line (WL) at the address of the row where data is to be written in the CAM cell array 120. The CAM system 100 writes the storage data to the specified address in the CAM cell array 120 using the bit line and the word line.

The CAM cell array 120 accepts search data for searching each entry of storage data through a search line (SL). The match line (ML) corresponding to each entry with the storage data matching the search data stays at high level.

The CAM cell array 120 includes a match line equalizer circuit 50. As being described in detail later, the match line equalizer circuit 50 is coupled to the border portions between plural parts generated by dividing the match line corresponding to each entry. The match line equalizer circuit 50 is coupled with signal lines (signal line EQ and signal line /EQ) used to supply equalization control signals. When comparing entry data stored in CAM cells and search data in accordance with an equalization control signal from the memory controller 110, the match line equalizer circuit 50 couples the divided parts of the match line. This equalizes the potentials of the divided match line parts.

The match amplifier 61 operates under the control of match amplifier control signals from the memory controller 110 and, in searching the CAM cell array 120, amplifies the output from the match lines.

When search data and storage data match for plural entries, the priority encoder 62 outputs the address corresponding to, out of the plural entries, one determined by a predetermined calculation. For example, searching the storage data for value "X" may find plural addresses at a time. At such a time, the priority encoder 62 outputs the search result for a priority entry, for example, a smallest-address entry.

When an address signal from the memory controller 110 is received, the address decoder 41 selects the CAM cell row in the CAM cell array 120 corresponding to the address.

The word line driver 42 operating in accordance with a read/write control signal from the memory controller 110 accepts address specification for data reading from or data writing to the CAM cell array 120 and activates the word line corresponding to the specified address.

The SL driver 91 drives the search line in accordance with a search line (SL) driver control signal from the memory controller 110. When searching the CAM cell array 120, search data is outputted to the CAM cell array 120 through the search line.

The bit line driver and read sense amplifier 70 drives the bit lines used to write data to the CAM cell array 120 in accordance with the control signals (e.g., sense amplifier control signals, write data control signals, and equalization control signals) from the memory controller 110. The bit line driver and read sense amplifier 70 amplifies the data read signals representing data read from the memory cells.

The memory controller 110 controls overall operations of the CAM system 100 by controlling the control signals. Namely, the memory controller 110 accepts address data and search data from outside using an address data I/O 111 and accepts various instructions (SEARCH, etc.) using an instruction input 112. The memory controller 110 operates based on a prescribed clock signal (CLK) received by a clock input 113 and outputs results of searching the CAM cell array 120 using a search result output 114.

<Detailed Cconfiguration of CAM Cell Array>

Figure 2:
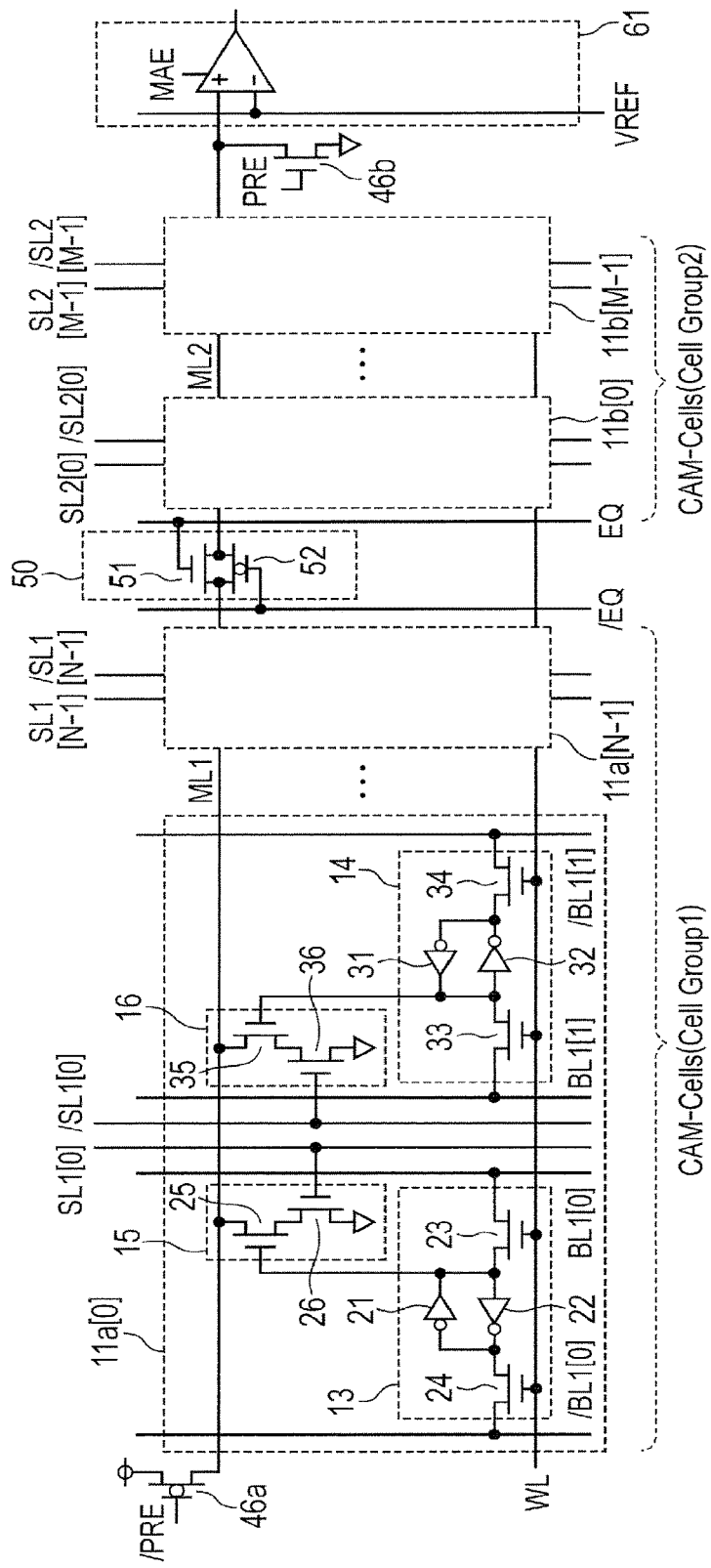
FIG. 2 shows detailed configurations of match lines and CAM cells.

FIG. 2 shows detailed configurations of the match lines and CAM cells.

As shown in FIG. 2, each row of the CAM cells included in the CAM cell array 120 corresponds to a piece of entry data, and each piece of entry data corresponds to a match line. Plural CAM cells corresponding to a piece of entry data are divided into two groups by the match line equalizer circuit 50. In the example shown in FIG. 2, as many as (N+M) CAM cells corresponding to a piece of entry data are divided into two groups, i.e. cell group 1 and cell group 2, by the match line equalizer circuit 50. Cell group 1 includes as many as N CAM cells (CAM cell 11a[0] to CAM cell 11a[N−1]. Cell group 2 includes as many as M CAM cells (CAM cell 11b[0] to CAM cell 11b[M−1]. A match line is divided into match line ML1 corresponding to cell group 1 and match line ML2 corresponding to cell group 2.

Each CAM cell includes an SRAM (static random access memory) 13, an SRAM 14, a search transistor (comparator circuit) 15, and a search transistor 16.

The SRAM 13 includes inverters 21 and 22 which are oppositely coupled in parallel, an NMOS transistor 23, and an NMOS transistor 24. The drain electrode of the NMOS transistor 24 is coupled to bit line /BL1[0]. The drain electrode of the NMOS transistor 23 is coupled to bit line BL1[0]. The gate electrodes of the NMOS transistors 24 and 23 are coupled to a word line WL.

The SRAM 14 includes inverters 31 and 32 which are oppositely coupled in parallel, an NMOS transistor 33, and an NMOS transistor 34. The drain electrode of the NMOS transistor 33 is coupled to bit line BL1[1]. The drain electrode of the NMOS transistor 34 is coupled to bit line /BL1[1]. The gate electrodes of the NMOS transistors 33 and 34 are coupled to a word line WL.

The search transistor 15 includes an NMOS transistor 25 and an NMOS transistor 26. In the search transistor 15, the gate electrode of the NMOS transistor 26 is coupled to a search line SL1[0]. Another electrode of the NMOS transistor 26 is grounded. A still another electrode of the NMOS transistor 26 is coupled to an electrode of the NMOS transistor 25. The gate electrode of the NMOS transistor 25 is coupled to an output of the inverter 21. Another electrode of the NMOS transistor 25 is coupled to the match line ML1.

The search transistor 16 includes an NMOS transistor 35 and an NMOS transistor 36. In the search transistor 16, the gate electrode of the NMOS transistor 36 is coupled to a search line /SL1[0]. Another electrode of the NMOS transistor 36 is grounded. Still another electrode of the NMOS transistor 36 is coupled to an electrode of the NMOS transistor 35. The gate electrode of the NMOS transistor 35 is coupled to an output of the inverter 31. Another electrode of the NMOS transistor 35 is coupled to the match line ML1. Thus, the search transistors 15 and 16 each include NMOS transistors only. Compared with cases in which two types of CAM cells are used with one type including PMOS search transistors generally larger than NMOS search transistors and the other type including NMOS search transistors, the semiconductor integrated circuit of the first embodiment includes only one type of CAM cells each including only one type of search transistors, i.e. NMOS search transistors. This makes it possible to use smaller chips for a cost reduction. Also, since only one type of CAM cell is required to be developed, design and process development costs can be reduced.

The CAM cells coupled to the match line ML1 are each configured identically to the CAM cell 11a[0] and are coupled to the corresponding search lines SLs and bit lines BLs. The CAM cells coupled to the match line ML2 are each configured identically to the CAM cell 11a[0] except that the search transistors 15 and 16 are coupled to the match line ML2 and are coupled to the corresponding search lines SLs and bit lines BLs.

A precharge circuit 46a is for precharging the match line ML1 to a first potential. In the example shown in FIG. 2, the precharge circuit 46a supplies the match line ML1 with a potential VDD (e.g., power potential) as a first potential using a signal /PRE. A precharge circuit 46b is for precharging the match line ML2 to a second potential. In the example shown in FIG. 2, the precharge circuit 46b supplies the match line ML2 with a potential VSS (e.g., ground potential: 0 V) as a second potential different from the first potential in accordance with a signal PRE. This sets the match line ML2 to potential VSS.

The match line equalizer circuit 50 is coupled to each border portion between plural match line parts (i.e. match lines ML1 and ML2 in the present example) generated by dividing the match line ML corresponding to a piece of entry data and couples the match lines ML1 and ML2 in accordance with equalization control signals EQ and /EQ. This sets the potentials of the match line ML1 precharged to the first potential (VDD) and the match line ML2 precharged to the second potential (VSS) to an intermediate potential.

Generally, a match line corresponding to an entry is coupled with CAM cells of about 80 bits. The parasitic capacitance of a match line is determined by its length and the number of CAM cells coupled to it. Therefore, when precharging the match line ML to potential VDD/2 by the match line equalizer circuit 50, the match line ML1 (a first part) is coupled with about a half of the CAM cells.

For example, of the CAM cells of 80 bits, 40 bits are coupled to the match line ML1 and the remaining 40 bits are coupled to the match line ML2. When necessary, the precharge potential VDD/2 for the match line ML can be lowered by decreasing the number of CAM cells coupled to the match line ML1 and increasing the number of CAM cells coupled to the match line ML2.

When necessary, for example, to speed up search operation, the intermediate potential of the match line ML can be raised by increasing the number of CAM cells coupled to the match line ML1 and decreasing the number of CAM cells coupled to the match line ML2.

However, in cases where the parasitic capacitance of each of the divided parts of a match line divided by the match line equalizer circuit 50 is not dependent on the number of CAM cells coupled to each divided part of the match line, it is necessary to adjust the lengths of the match lines ML1 and ML2 and the numbers of CAM cells coupled to the match lines ML1 and ML2, respectively, such that the match lines ML1 and ML2 can be equalized to a desired intermediate potential by the match line equalizer circuit 50.

In the example shown in FIG. 2, the match amplifier 61 is coupled to the match line ML2. Note that the match amplifier 61 is required to be coupled to either one of the match lines ML1 and ML2. In the first embodiment, after the divided parts of the match line are equalized by the equalizer circuit 50, the match amplifier 61 senses the match line potential with the divided match lines ML1 and ML2 coupled to each other. When the search results corresponding to the divided match lines ML1 and ML2 are both mismatches, the match lines ML1 and ML2 are discharged from the intermediate potential generated by equalization to the second potential (VSS). In this way, when the search results corresponding to the divided match lines ML1 and ML2 are both mismatches, activating the search lines with the divided match lines ML1 and ML2 coupled to each other does not cause shorting between the first potential (VDD) and second potential (VSS). When the search results corresponding to the divided match lines ML1 and ML2 are both matches, the match line potential becomes the intermediate potential generated by equalization. When only one of the search results corresponding to the divided match lines ML1 and ML2 is a mismatch, the match line potential becomes the second potential (VSS).

Thus, according to the CAM system 100 of the first embodiment, the match line potential can be sensed by the match amplifier 61 in a state with the divided match lines ML1 and ML2 coupled to each other by the match line equalizer circuit 50. Therefore, in the CAM system 100, only one match amplifier per entry is required. This makes it possible to reduce the chip area and, hence, the chip cost compared with cases in which plural match amplifiers per entry are required.

<Operation of First Embodiment>

Figure 3:
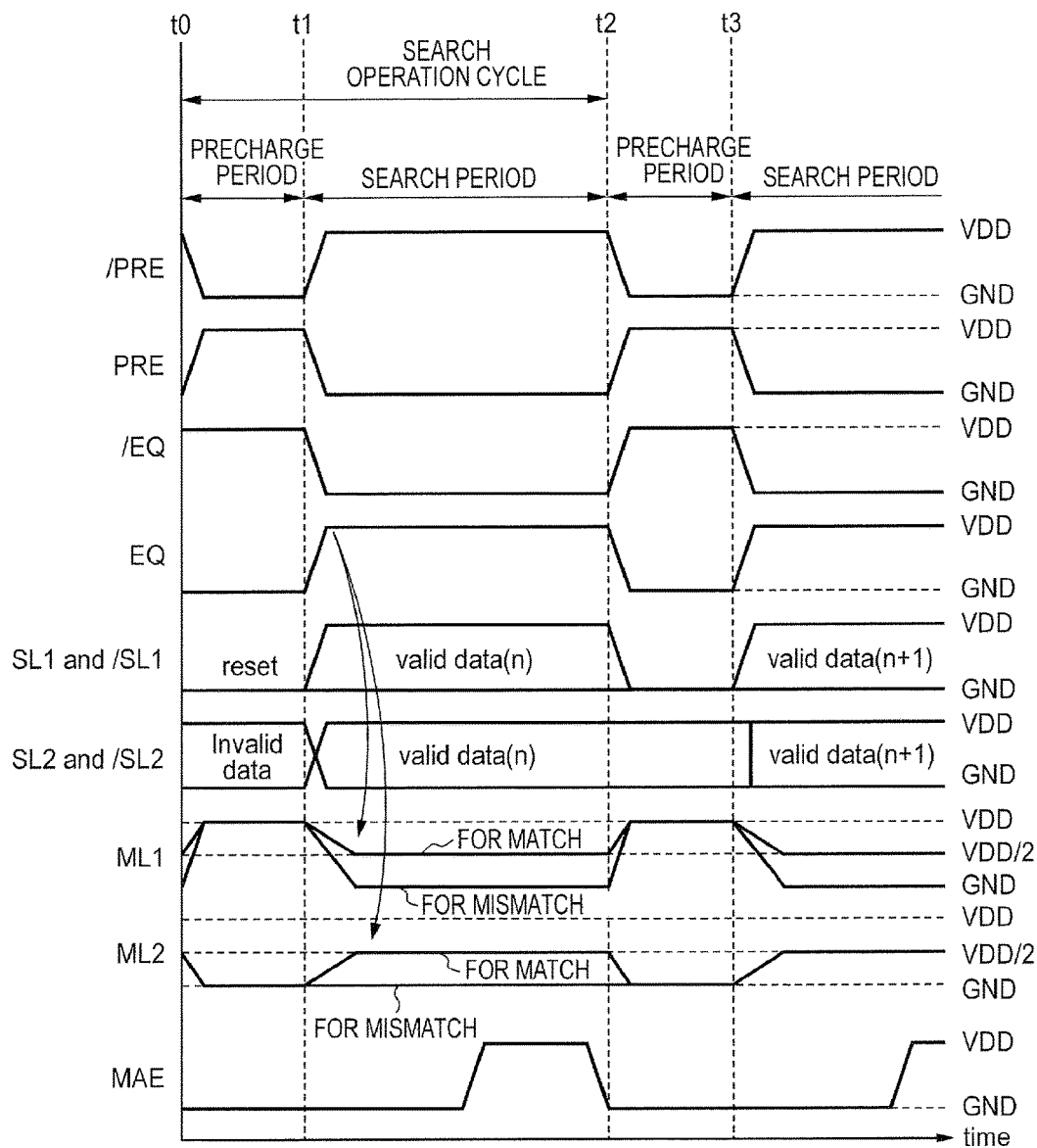
FIG. 3 shows search operation waveforms of the CAM system (100) of the first embodiment.

FIG. 3 shows search operation waveforms of the CAM system 100 of the first embodiment. The waveforms shown in FIG. 3 are of, from top downward, signal /PRE supplied to the precharge circuit 46a, signal PRE supplied to the precharge circuit 46b, signals /EQ and EQ supplied to the match line equalizer circuit 50, signals SL1 and /SL1 supplied to search lines SL1 corresponding to the CAM cells of cell group 1 coupled to the match line ML1, signals SL2 and /SL2 supplied to search lines SL2 corresponding to the CAM cells of cell group 2 coupled to the match line ML2, the potential of the match line ML1, the potential of the match line ML2, and signal MAE supplied to the match amplifier 61.

In an initial state before searching of the CAM cell array 120 is started, the respective signals are inactive and the search lines SL1 are reset to potential VSS. Because the match line ML is divided into the match lines ML1 and ML2 by the match line equalizer circuit 50 and the match line ML2 is precharged to potential VSS, the search line SL2 is isolated from potential VDD during the precharge period. Hence, the search line SL2 need not be reset. It is in an indefinite state or it continuously outputs the search data used in the last search.

At time t0, the CAM system 100 sets signal /PRE low and signal PRE high, and precharges the match line ML1 to potential VDD and the match line ML2 to potential VSS. Precharging of the divided match lines each with a small parasitic capacitance can be completed in a relatively short period of time.

At time t1, the CAM system 100 sets signal /EQ low and signal EQ high, and the match line equalizer circuit 50 couples the match lines ML1 and ML2 and equalizes them, thereby, starting generation of an intermediate potential. Also, in the CAM system 100 of the first embodiment, at the same time as starting of equalization, search operation based on search data is started by supplying signals SL1 and /SL1 to the search line SL1 and signals SL2 and /SL2 to the search line SL2. Namely, signals SL1 and /SL1 are switched to be valid search data.

As described above, search operation can be started at the same time as equalization. The CAM system 100 can, therefore, shorten the search operation cycle and speed up search operation. When the search data supplied through the search line SL cannot find a match in the entry data stored in the CAM cells, the match line ML is discharged from a high potential (VDD/2) to a low potential (VSS). When, for the search data supplied through the search line SL, a match is found in the entry data stored in the CAM cells, the potential of the match line ML is kept high (VDD/2). Therefore, after ending of the period during which the match lines ML1 and ML2 are equalized, the CAM system 100 sets signal MAE high to start sensing of the match line potential by the match amplifier 61. When the potential of the match line ML is high (VDD/2), the match amplifier 61 determines that the search data and the entry data match each other. When the potential of the match line ML is low (VSS), the match amplifier 61 determines that the search data and the entry data do not match each other.

When the match amplifier 61 ends outputting a determination result, the CAM system 100 sets signal MAE low, signal /EQ high and signal EQ low to end the search operation. The search line SL1 is reset to potential VSS so as to prevent an inrush of a shoot-through current at the time of precharging. For the search line SL2, however, resetting is not necessary. This is because, as described above, the search line SL2 is isolated from the match line ML1 by the match line equalizer circuit 50, so that no shoot-through current rushes in during the precharge period. Generally, it does not often occur that all bits of search data are reversed every time search operation is made. Therefore, by holding the search data on the search line SL2, the current charged to or discharged from the search line SL2 can be reduced. This can reduce the power consumption of the CAM memory system 100.

At time t2, the CAM system 100 starts precharging the match line ML for next search operation. At time t3, the CAM system 100 starts equalization of the match lines ML1 and ML2 by the match line equalizer circuit 50 and starts search operation. Subsequently, the same process is repeated.

Second Embodiment

A CAM system according to a second embodiment of the present invention will be described below with reference to FIGS. 4 and 5.

Figure 4:
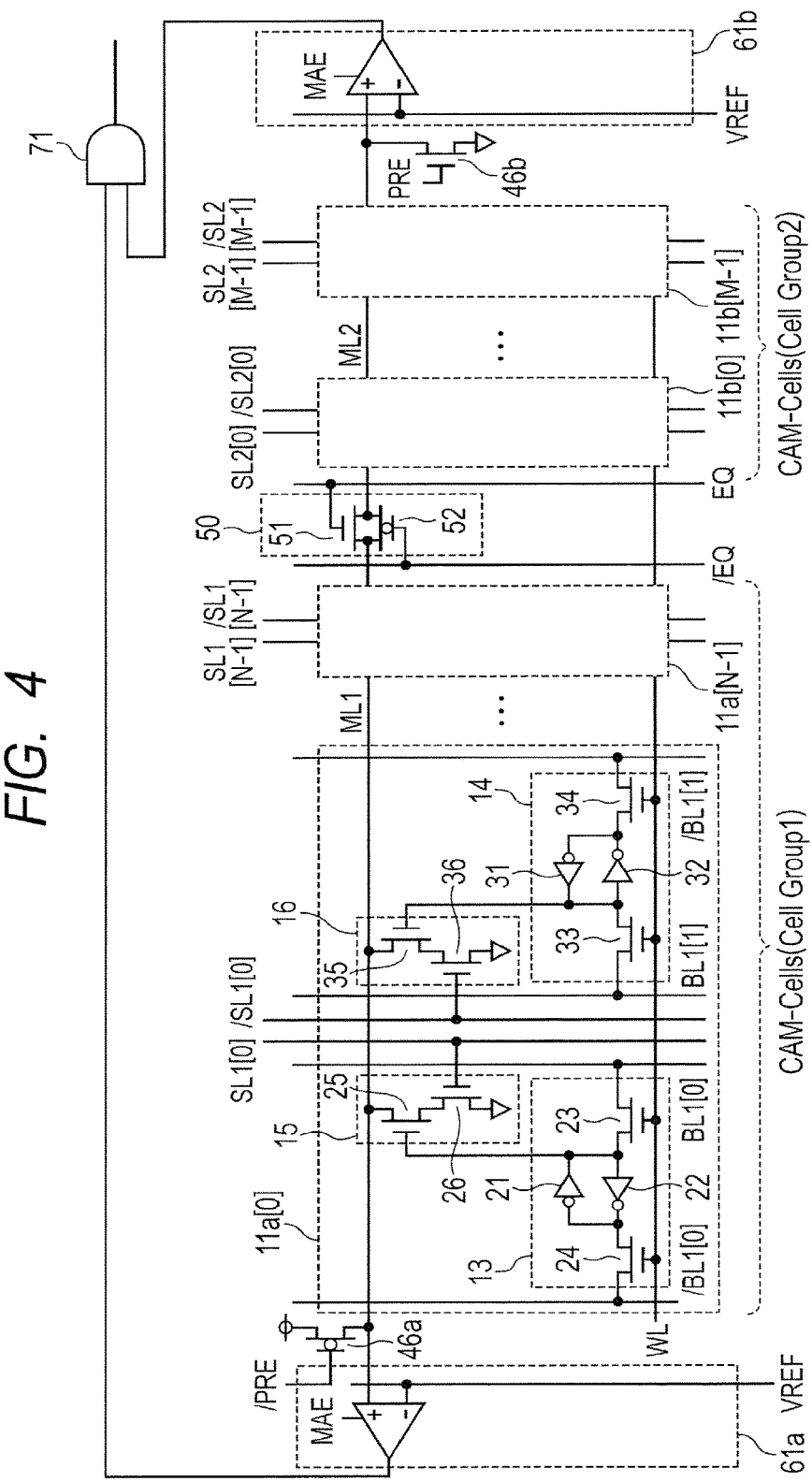
FIG. 4 shows the configuration of a CAM cell array (120) according to a second embodiment of the present invention.

FIG. 4 shows the configuration of a CAM cell array 120 according to the second embodiment. In the first embodiment, a match line corresponding to a piece of entry data is divided into two parts and one of the two parts is coupled with the match amplifier 61. In the second embodiment, the two parts of a match line divided by the match line equalizer circuit 50 are coupled with match amplifiers 61a and 61b, respectively. Therefore, in the CAM system of the second embodiment, search operation can be performed faster while reducing current consumption.

<Operation of Second Embodiment>

Figure 5:
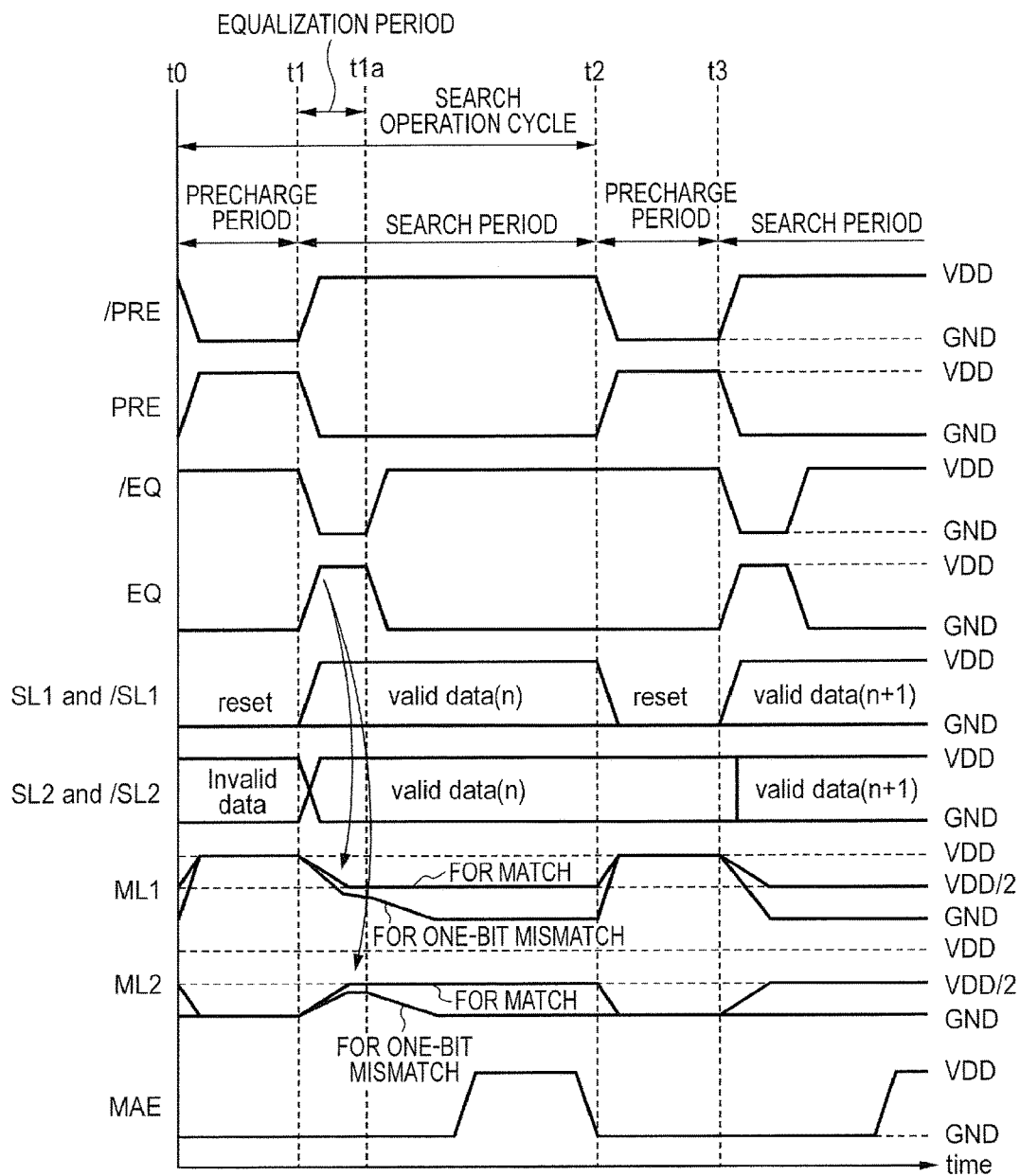
FIG. 5 shows search operation waveforms of the CAM system of the second embodiment.

FIG. 5 shows search operation waveforms of the CAM system of the second embodiment.

In the second embodiment compared with the first embodiment, the two parts of a match line, i.e. a first part (match line ML1) and a second part (match line ML2) generated by dividing the match line by the match line equalizer circuit 50 are equalized by setting signal /EQ low and signal EQ high in an equalization period (a period from time t1 to time t1a) which is shorter than the equalization period in the first embodiment.

At time t1a, the CAM system ends equalization of the match line parts by setting signal /EQ high and signal EQ low and starts search operation by supplying search data to the search line. Normally, when a one-bit mismatch occurs between search data supplied to CAM cells through the search line and the entry data, the match line charged to potential VDD/2 by equalization is discharged down to potential VSS through the CAM cell of the mismatching bit. In this manner, it takes time before the match line potential lowers to a level where the match amplifier can detect the mismatch. This slows down the search operation.

In the CAM system of the second embodiment, the match line parts are isolated from each other by the match line equalizer circuit 50 immediately after they are adequately equalized, so that the parasitic capacitance of each of the match line parts is reduced.

This advances, when a mismatch occurs between the entry data and the search data, discharging of the potentials of the divided match line parts, so that starting and ending of potential sensing by the match amplifiers 61a and 61b can be advanced. The outputs of the match amplifiers 61a and 61b are logically added at an AND circuit 71 and the logical sum is inputted to the priority encoder 62. According to the CAM system of the second embodiment, outputting of the result of determination by the match amplifiers can be further advanced. This makes it possible to shorten the search operation cycle and perform the search operation faster.

Third Embodiment

A CAM system according to a third embodiment of the present invention will be described below with reference to FIGS. 6 and 7.

Figure 6:
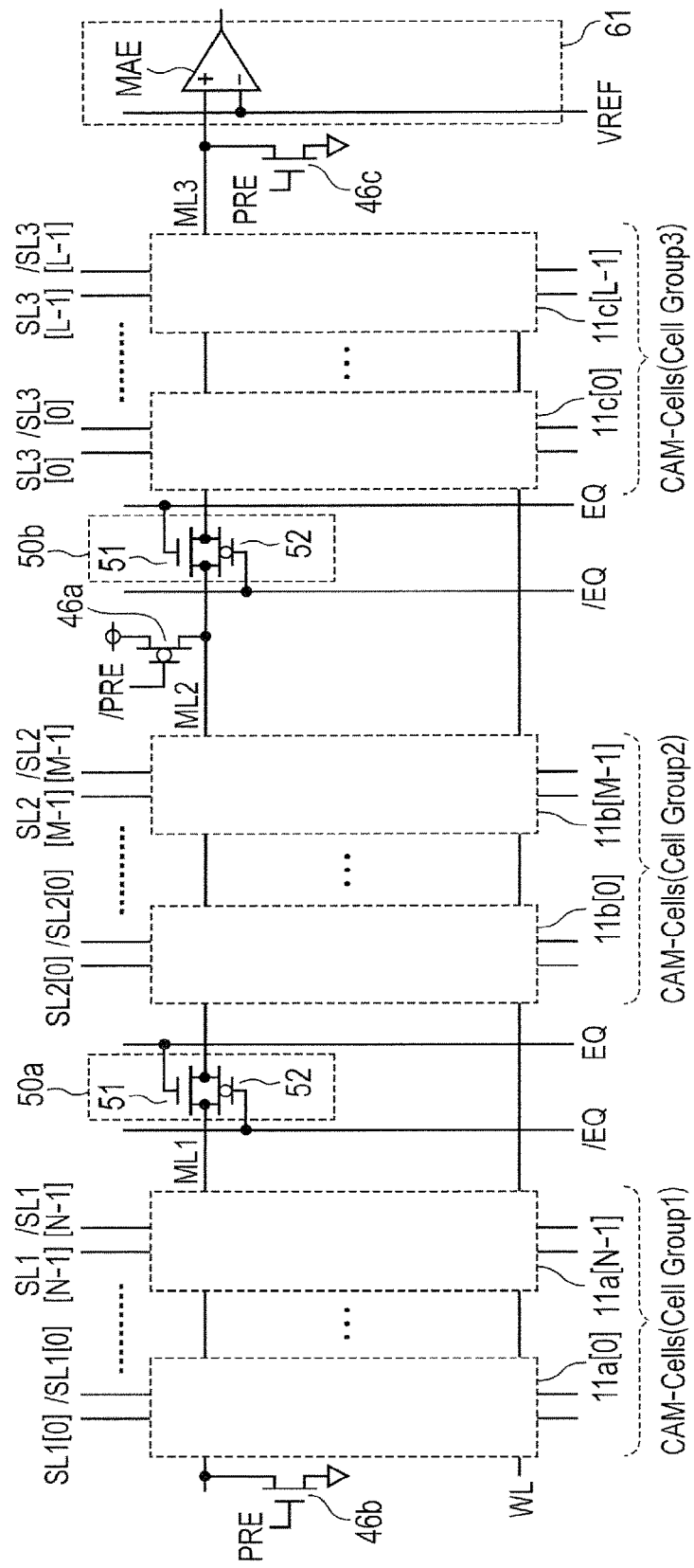
FIG. 6 shows the configuration of a CAM cell array (120) according to a third embodiment of the present invention.

FIG. 6 shows the configuration of a CAM cell array 120 according to the third embodiment. In the third embodiment, a match line corresponding to a piece of entry data is divided into three parts (match lines ML1, ML2, and ML3). Two equalizer circuits (match line equalizer circuits 50a and 50b) are coupled to two border portions between the three divided match line parts.

Each of the divided match line parts is coupled with one of three precharge circuits, i.e. a precharge circuit 46a for precharging to potential VDD and precharge circuits 46b and 46c for precharging to potential VSS.

The divided match line parts (match lines ML1, ML2, and ML3) are each set to an intermediate potential level by equalization by the match line equalizer circuits 50a and 50b. In cases where the parasitic capacitance of each of the divided match line parts is dependent on the number of CAM cells coupled to each divided match line part, the intermediate potential level is determined by the ratio between the number of CAM cells coupled to the match line ML2 that is coupled with the precharge circuit 46a for precharging to potential VDD and the number of CAM cells coupled to the match line ML1 that is coupled with the precharge circuit 46b for precharging to potential VSS and to the match line ML3 that is coupled with the precharge circuit 46c also for precharging to potential VSS. The following description of the third embodiment is based on the assumption that the equalizer circuits (match line equalizer circuits 50a and 50b) are coupled to the match line so as to obtain an intermediate potential of VDD/3.

Though, in the third embodiment, a match line is divided into three parts, the match line may be divided into more parts. By dividing a match line into a larger number of parts, the parasitic capacitance of each divided match line part can be more reduced. This makes it possible to further reduce the time required for search operation and the search operation cycle in the case of a one-bit mismatch.

<Operation of Third Embodiment>

Figure 7:
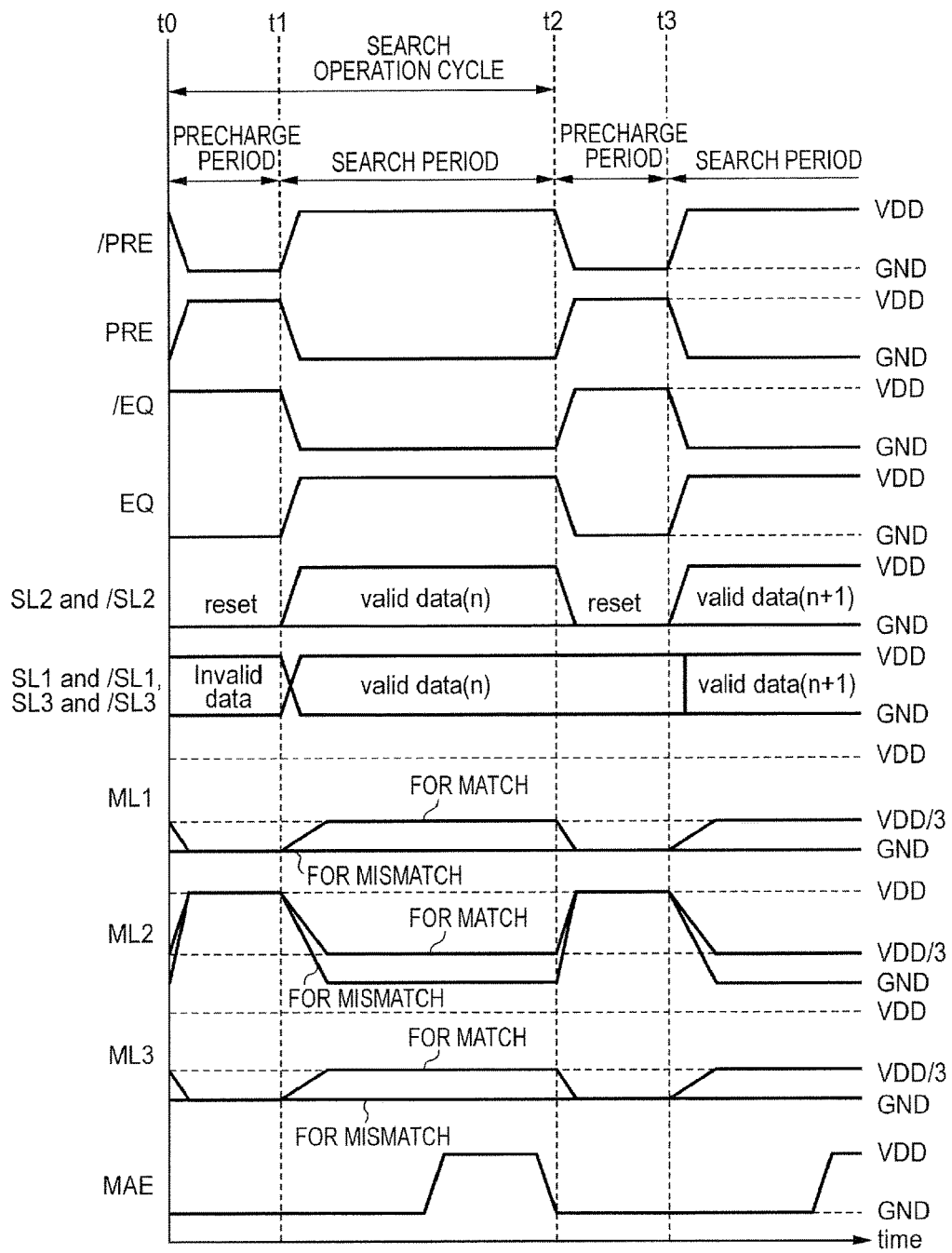
FIG. 7 shows search operation waveforms of the CAM system of the third embodiment.

FIG. 7 shows search operation waveforms of the CAM system of the third embodiment.

In the example shown in FIG. 7, as a result of equalization by the match line equalizer circuit 50 (match line equalizer circuits 50a and 50b), the match line is set to an intermediate potential (VDD/3).

Referring to FIG. 6, the match amplifier 61 is coupled to the divided match line ML3, but the match amplifier 61 may be coupled to any one of the divided match lines ML1, ML2, and ML3. In the third embodiment, after the divided match lines are equalized by the equalizer circuits 50a and 50b, the match amplifier 61 senses the match line potential with the divided match lines ML1, ML2, and ML2 coupled together.

When the search results corresponding to the divided match lines ML1, ML2, and ML3 are all mismatches, all the match lines ML1, ML2, and ML2 are discharged from the intermediate potential generated by equalization down to the second potential (VSS). Therefore, when the search results corresponding to the divided match lines ML1, ML2, and ML3 are all mismatches at a time in the CAM system, activating the search lines with the divided match lines ML1, ML2, and ML3 coupled together does not cause shorting between the first potential (VDD) and the second potential (VSS). When the search results corresponding to the divided match lines ML1, ML2, and ML3 are all matches, the divided match lines are all set to the intermediate potential generated by equalization. When any one of the search results corresponding to the divided match lines ML1, ML2, and ML3 is a mismatch, the divided match lines are all set to the second potential (VSS). Thus, according to the CAM system of the third embodiment, the match line potential can be sensed by the match amplifier in a state with the divided match lines ML1, ML2, and ML3 coupled together. Therefore, in the CAM system, only one match amplifier per entry is required. This makes it possible to reduce the chip area and, hence, the chip cost compared with cases in which plural match amplifiers per entry are required.

Fourth Embodiment

A CAM system according to a fourth embodiment of the present invention will be described below with reference to FIGS. 8 and 9.

Figure 8:
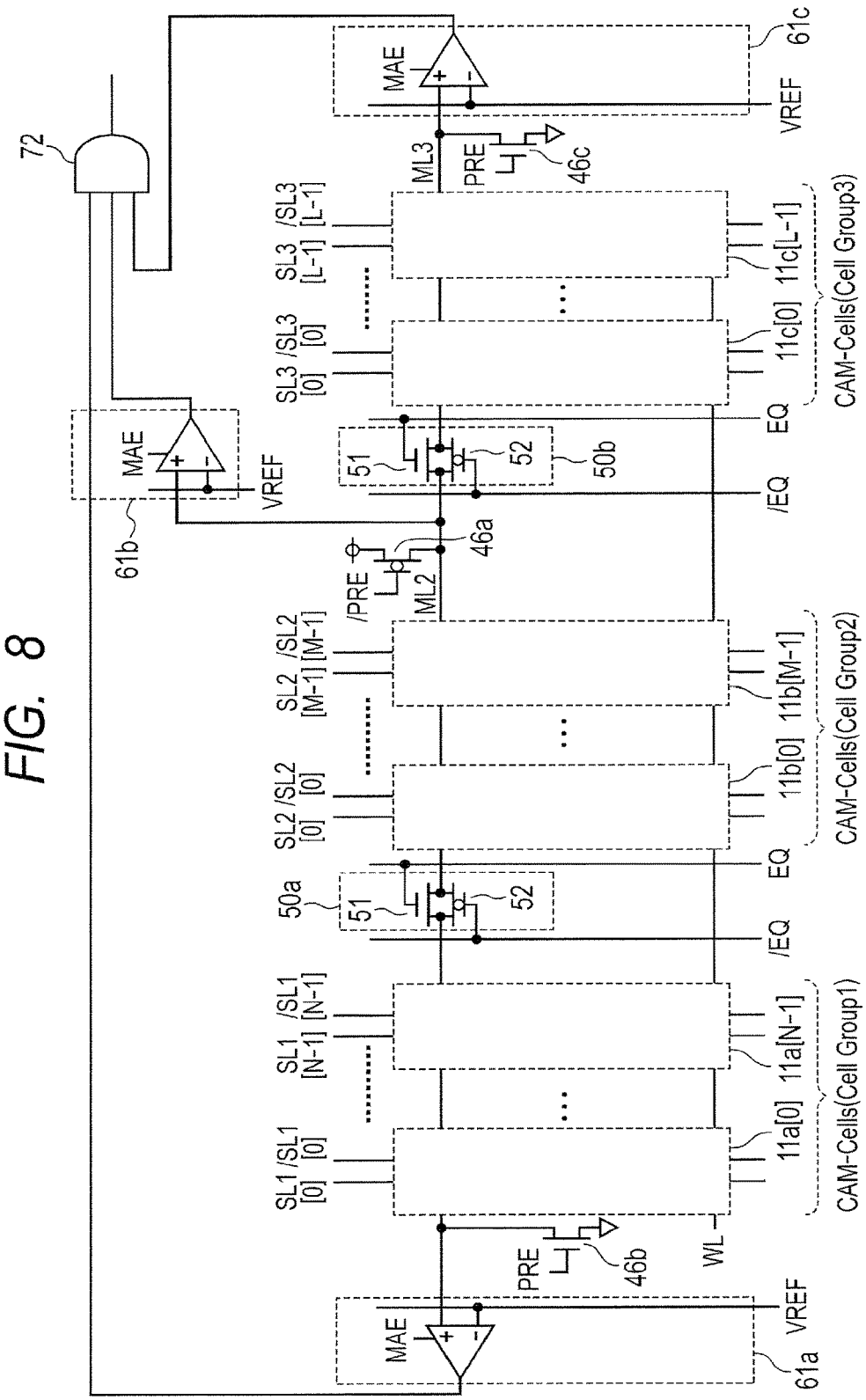
FIG. 8 shows the configuration of a CAM cell array (120) according to a fourth embodiment of the present invention.

FIG. 8 shows the configuration of a CAM cell array 120 according to the fourth embodiment. In the fourth embodiment compared with the third embodiment, the three divided parts of a match line are each coupled with a match amplifier. Namely, match lines ML1, ML2, and ML3 are coupled with match amplifiers 61a, 61b, and 61c, respectively. Therefore, in the CAM system of the fourth embodiment, search operation can be performed further faster while reducing current consumption.

<Operation of Fourth embodiment>

Figure 9:
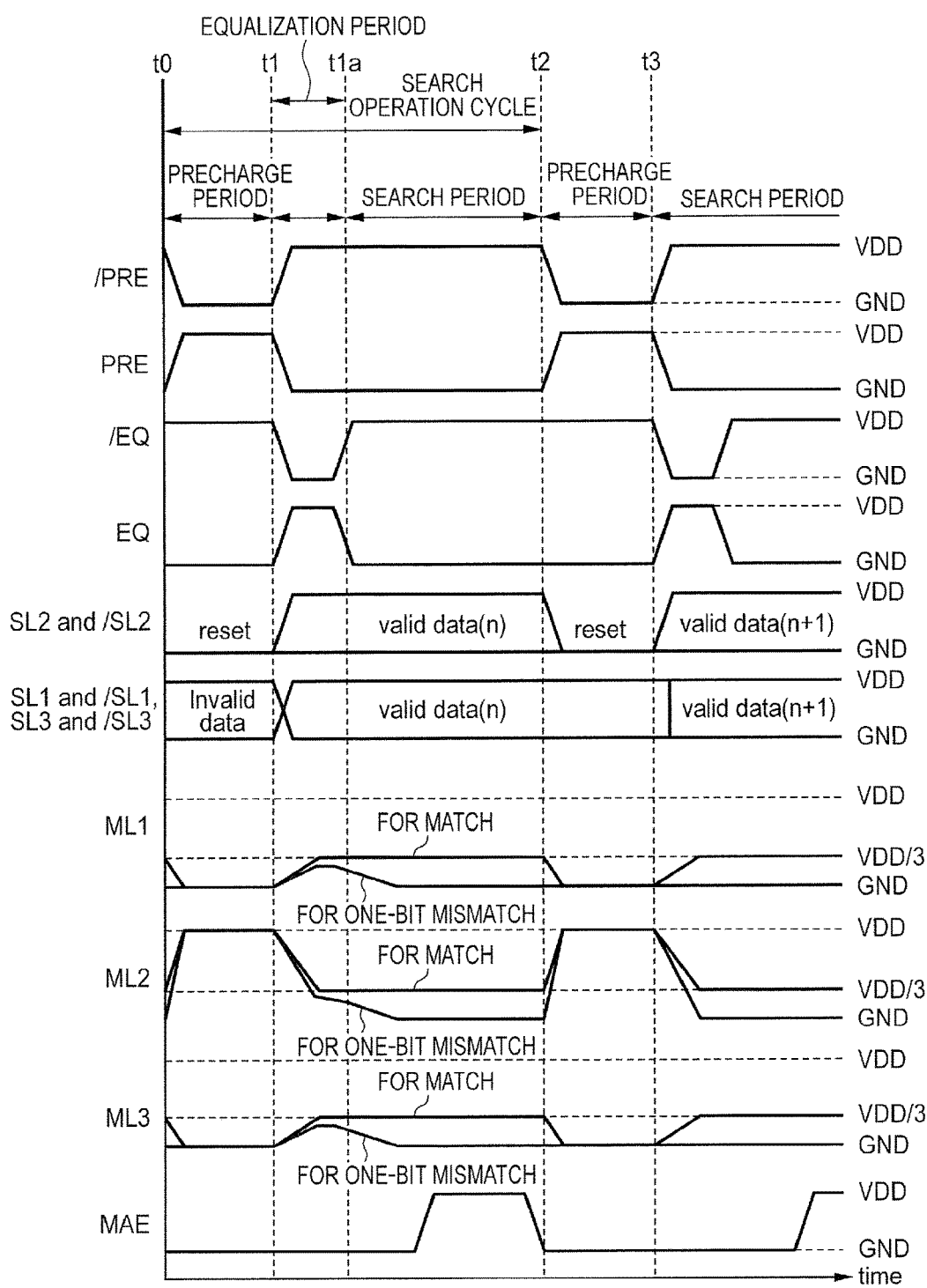
FIG. 9 shows search operation waveforms of the CAM system of the fourth embodiment.

FIG. 9 shows search operation waveforms of the CAM system of the fourth embodiment. In the fourth embodiment as shown in FIG. 9, as a result of equalization by the match line equalizer circuit 50 (match line equalizer circuits 50a and 50b), the match line potential becomes an intermediate potential (VDD/3).

In the fourth embodiment compared with the third embodiment, the three parts of a match line, i.e. a first part (match line ML1), a second part (match line ML2), and a third part (match line ML3) generated by dividing the match line by the match line equalizer circuits 50a and 50b are equalized by setting signal /EQ low and signal EQ high in an equalization period (a period from time t1 to time t1a) which is shorter than the equalization period in the third embodiment.

At time t1a, the CAM system ends match line equalization by setting signal /EQ high and signal EQ low and starts search operation by supplying search data to the search line. Normally, when a one-bit mismatch occurs between search data supplied to the CAM cells through the search line and the entry data, the match line charged to an intermediate potential (VDD/2) is discharged down to potential VSS through the CAM cell of the mismatching bit, so that discharging takes time.

In the CAM system of the fourth embodiment, the match line parts are isolated from one another by the match line equalizer circuits 50a and 50b immediately after they are adequately equalized, so that the parasitic capacitance of each of the match line parts is reduced.

This advances, when a mismatch occurs between the entry data and the search data, discharging of the potentials of the divided match line parts, so that starting of potential sensing by the match amplifiers 61a, 61b, and 61c can be advanced. The outputs of the match amplifiers 61a, 61b, and 61c are logically added at an AND circuit 72 and the logical sum is inputted to the priority encoder 62. According to the CAM system of the fourth embodiment, outputting of the result of determination by the match amplifiers can be further advanced. This makes it possible to shorten the search operation cycle and perform the search operation faster.

Fifth Embodiment

A CAM system according to a fifth embodiment of the present invention will be described below with reference to FIG. 10.

Figure 10:
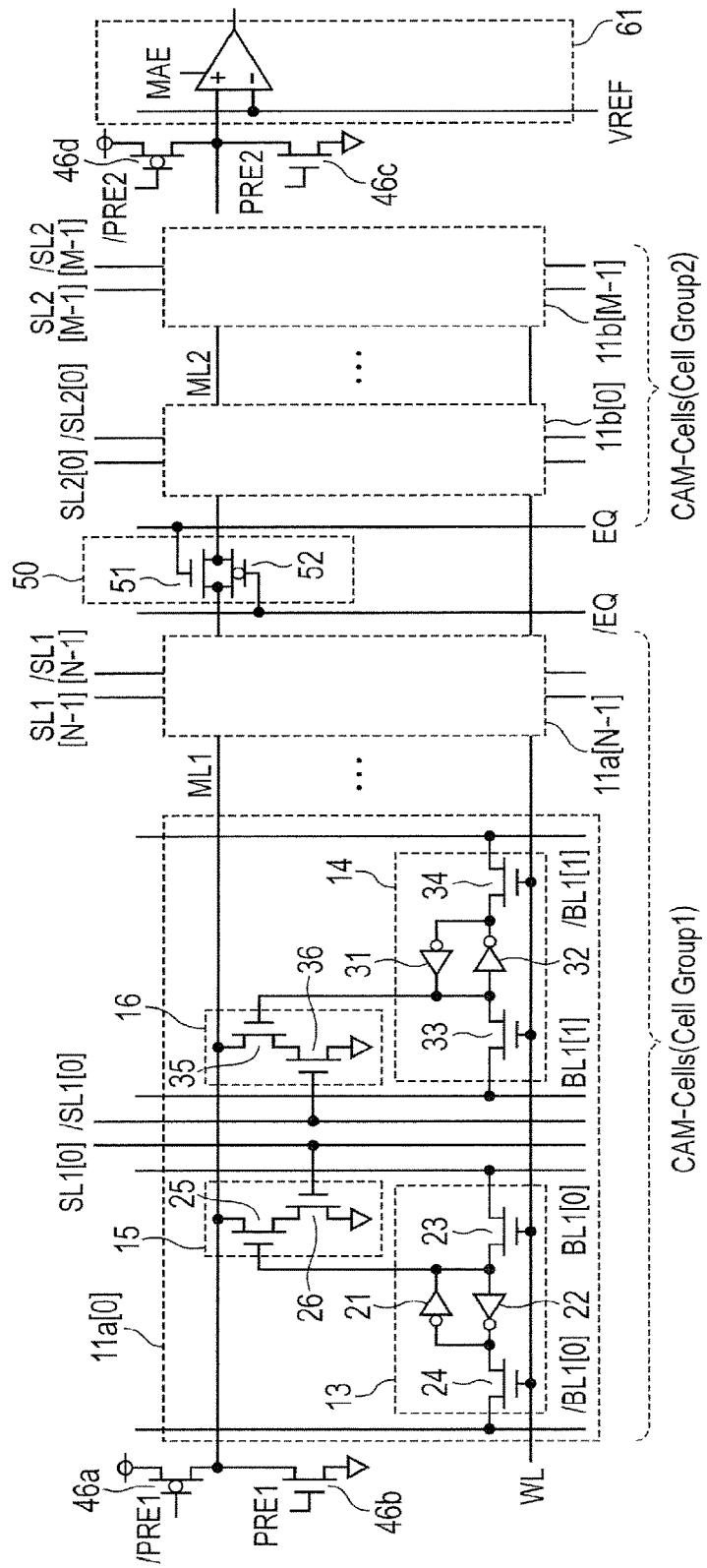
FIG. 10 shows the configuration of a CAM cell array (120) according to a fifth embodiment of the present invention.

FIG. 10 shows the configuration of a CAM cell array 120 according to the fifth embodiment. In the fifth embodiment compared with the first embodiment, the two match line parts (match lines ML1 and ML2) generated by dividing a match line by the match line equalizer circuit 50 are each coupled with a precharge circuit for precharging to potential VDD and a precharge circuit for precharging to potential VSS. In the example shown in FIG. 10, the match line ML1 is coupled with precharge circuits 46a and 46b, and the match line ML2 is coupled with precharge circuits 46c and 46d.

The precharge circuits 46a and 46d for precharging the match line to potential VDD have signals /PRE1 and /PRE2 inputted to them, respectively. The precharge circuits 46b and 46c for precharging the match line to potential VSS have signals PRE1 and PRE2 inputted to them, respectively.

In the fifth embodiment, the match line ML1 can be precharged to potential VSS by setting signals /PRE1 and PRE1 both high in a precharge period. Also, the match line ML2 can be precharged to potential VDD by setting signals /PRE2 and PRE2 both low in a precharge period.

As described above, in the CAM system, the match line parts can be precharged to either potential VDD or potential VSS. For example, assume that a match line is divided into two parts having an equal parasitic capacitance. When, in this case, the two match line parts are precharged to potential VDD, the match line potential after equalization is VDD. Alternatively, when one of the two match line parts is precharged to potential VDD and the other of the two match line parts is precharged to potential VSS, the match line potential after equalization is VDD/2. Namely, the match line potential after equalization is selectable by signal control.

Generally, when a match line is precharged to a higher potential, a higher potential is inputted to the match amplifier, and the potential differences between the gate and the drain and between the gate and the source of the transistor included in the match amplifier become larger. This increases the source-drain current of the transistor to allow the CAM system to operate at a higher speed. When a match line is precharged to a lower potential, the charge/discharge current of the match line is reduced to reduce power consumption. Namely, in the fifth embodiment, it is possible to select, just by means of signal control, between VDD as the match line potential after equalization with priority on faster operation and VDD/2 as the match line potential after equalization with priority on lower power consumption.

Sixth Embodiment

A CAM system according to a sixth embodiment of the present invention will be described below with reference to FIG. 11.

Figure 11:
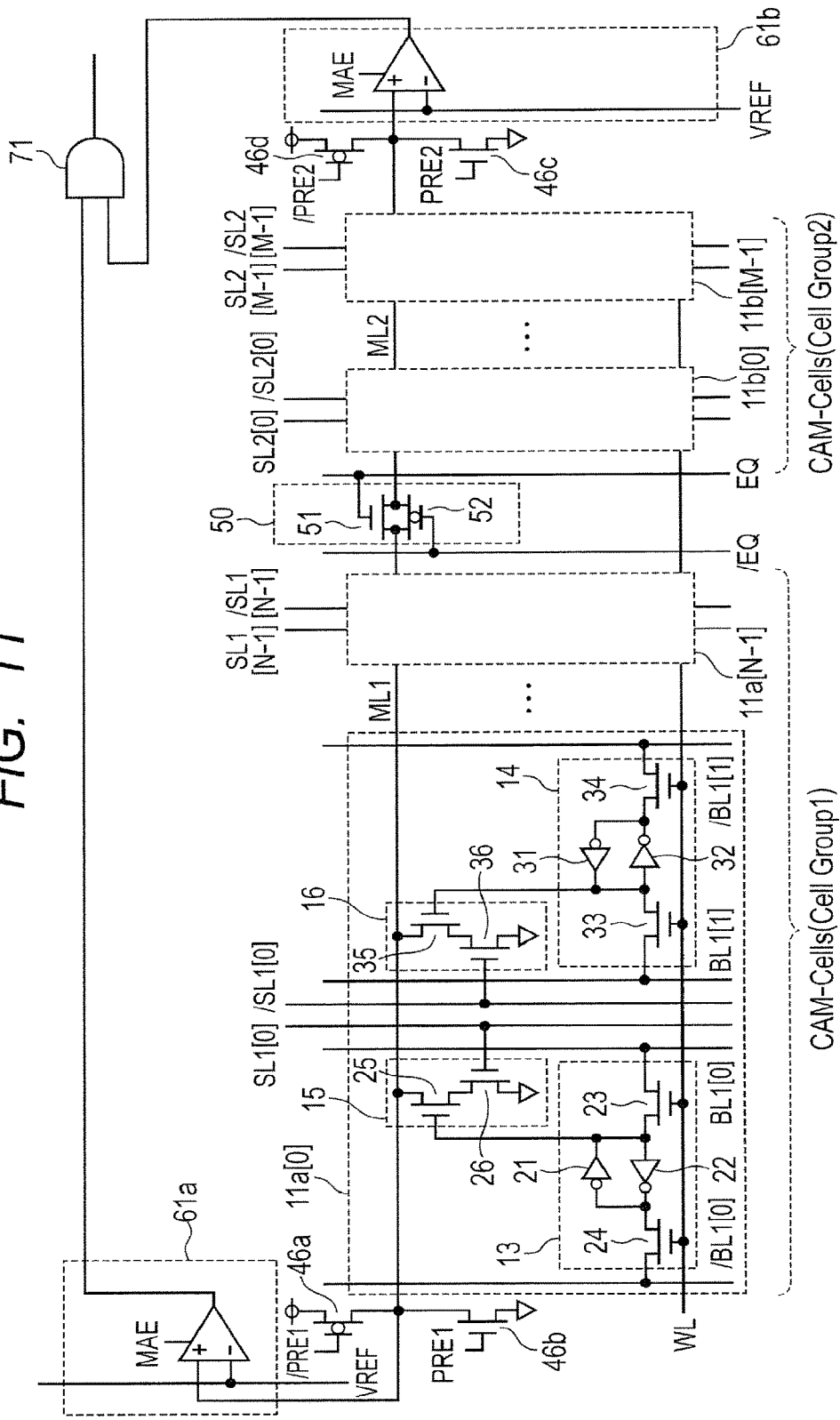
FIG. 11 shows the configuration of a CAM cell array (120) according to a sixth embodiment of the present invention.

FIG. 11 shows the configuration of a CAM cell array 120 according to the sixth embodiment. In the sixth embodiment, the CAM cell array 120 is configured as in the fifth embodiment but with a match amplifier coupled to each of the divided match line parts as in the second embodiment. This makes it possible to control, depending on the process finish or memory usage condition, the potential level to which the match line is precharged for search operation and realize faster search operation.

Seventh Embodiment

A CAM system according to a seventh embodiment of the present invention will be described below with reference to FIG. 12.

Figure 12:
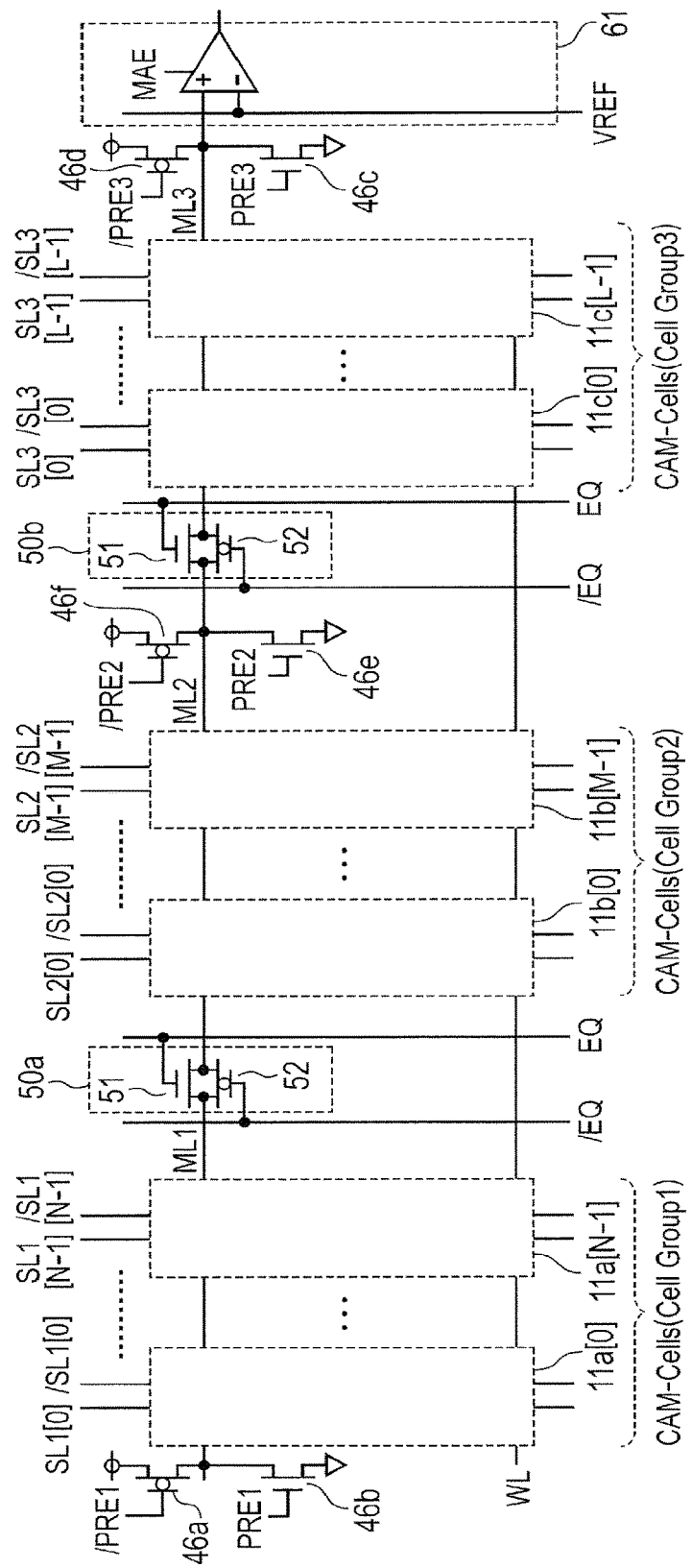
FIG. 12 shows the configuration of a CAM cell array (120) according to a seventh embodiment of the present invention.

FIG. 12 shows the configuration of a CAM cell array 120 according to the seventh embodiment. In the configuration of the seventh embodiment compared with the configuration of the fifth embodiment, a match line corresponding to a piece of entry data is divided into three parts as in the third embodiment.

Therefore, as in the third embodiment, by dividing a match line into more parts, the parasitic capacitance of each divided match line part can be more reduced. This makes it possible to further reduce the time required for search operation and the search operation cycle in the case of a one-bit mismatch. Also, as in the fifth embodiment, the divided match line parts can be precharged to either potential VDD or potential VSS. For example, assume that a match line is divided into three parts having an equal parasitic capacitance. When, in this case, the three match line parts are all precharged to potential VDD, the match line potential after equalization is VDD. When two of the three match line parts are precharged to potential VDD and the remaining match line part is precharged to potential VSS, the match line potential after equalization is VDD.2/3. When one of the three match line parts is precharged to potential VDD and the other two match line parts are precharged to potential VSS, the match line potential after equalization is VDD/3. Namely, in the seventh embodiment, it is possible to select, just by using a control signal, among VDD as the match line potential after equalization with priority on faster operation, VDD/3 as the match line potential after equalization with priority on lower power consumption, and VDD.2/3 as an intermediate match line potential after equalization coming between VDD and VDD/3.

Eighth Embodiment

A CAM system according to an eighth embodiment of the present invention will be described below with reference to FIG. 13.

Figure 13:
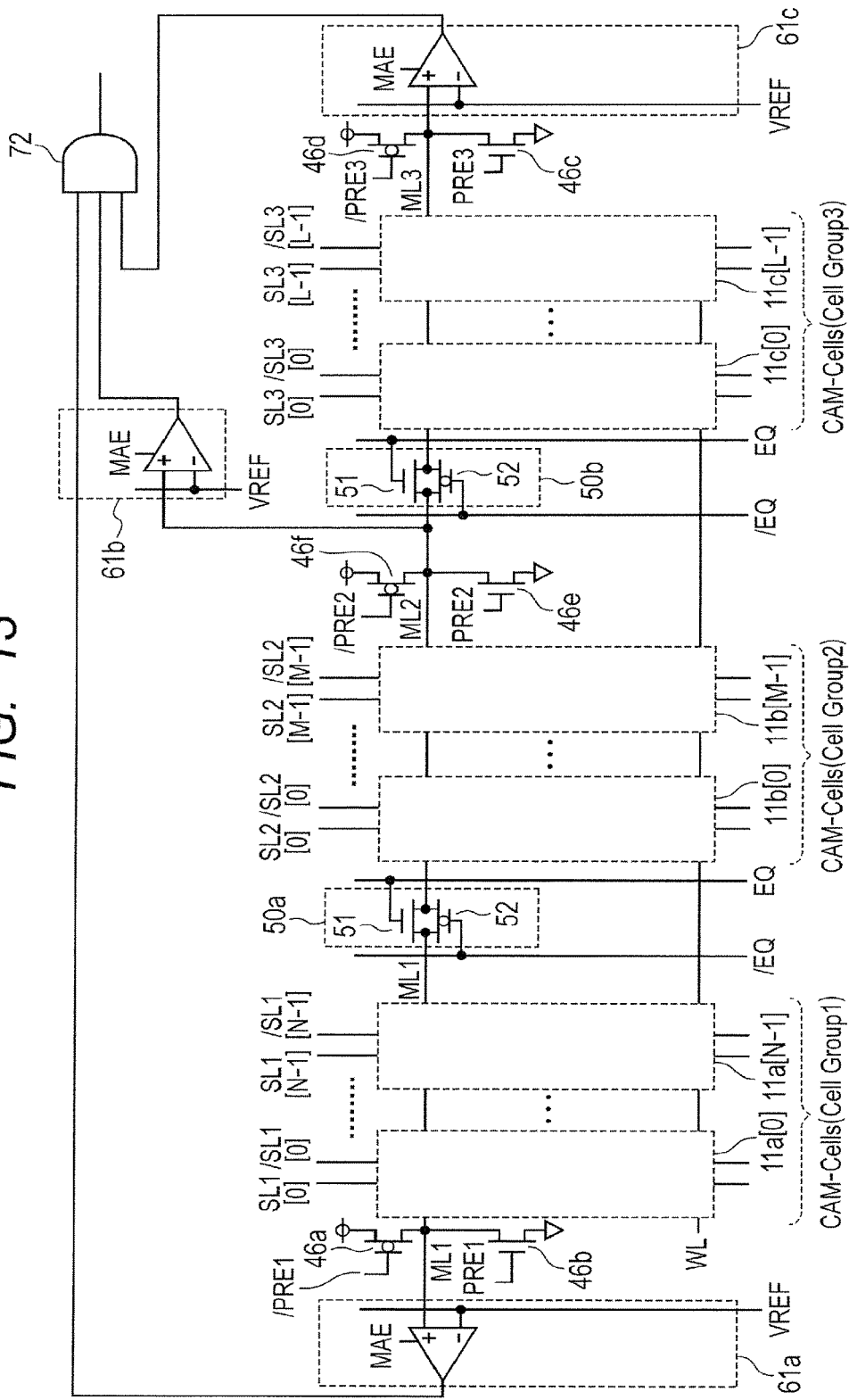
FIG. 13 shows the configuration of a CAM cell array (120) according to an eighth embodiment of the present invention.

FIG. 13 shows the configuration of a CAM cell array 120 according to the eighth embodiment. In the eighth embodiment compared with the seventh embodiment, the three divided parts of a match line are each coupled with a match amplifier as in the fourth embodiment.

In the above configuration, dividing a match line into more parts more reduces the parasitic capacitance of each divided match line part. This makes it possible to further reduce the time required for search operation and the search operation cycle in the case of a one-bit mismatch. Also, in the CAM system, search operation can be made faster while reducing current consumption.

Embodiments of the present invention have been described. Obviously, the above embodiments may be practiced in combination.

Even though the invention made by the present inventors has been described in concrete terms based on the above embodiments, the invention is not limited by the above embodiments. Obviously, the invention can be modified in various ways within the scope thereof.

The embodiments disclosed above are, in all respects, intended to be illustrative and not restrictive. The scope of the present invention is defined not by the above description but by the appended claims and all modifications within the scope of the appended claims and their equivalents will be construed as being included in the present invention.

What is claimed is:

1. A semiconductor integrated circuit including a content addressable memory device, comprising:
    a memory cell array including:
        a first memory cell containing a first part of entry data and a second memory cell containing a second part of the entry data;
        a first match line and a second match line coupled to the first memory cell and the second memory cell, respectively; and
        a first search line carrying a first part of search data and a second search line carrying a second part of the search data, the first search line and the second search line being coupled to the first memory cell and the second memory cell, respectively;
    an equalizer circuit disposed between the first match line and the second match line;
    a first precharge circuit being coupled to the first match line, and precharging the first match line to a first potential; and
    a second precharge circuit being coupled to the second match line, and precharging the second match line to a second potential different from the first potential,
    wherein the first memory cell includes a first comparator circuit comparing the first part of the search data supplied through the first search line and the first part of the entry data,
    wherein the second memory cell includes a second comparator circuit comparing the second part of the search data supplied through the second search line and the second part of the entry data,
    wherein the equalizer circuit couples, in accordance with a control signal, the first match line and the second match line after the first match line and the second match line are precharged, and
    wherein the first search line and the second search line are each supplied with a search signal based on a valid data at the same time as the first match line and the second match line are coupled by the equalizer circuit.

2. The semiconductor integrated circuit according to claim 1, wherein the first comparator circuit is coupled between the first match line and the first potential line, and the second comparator circuit is coupled between the second match line and the first potential line.

3. The semiconductor integrated circuit according to claim 1, wherein the second comparator circuit includes transistors of the same conductivity type as those of the first comparator circuit.

4. The semiconductor integrated circuit according to claim 1, further comprises a match amplifier coupled to at least one of the first and the second match line.

5. The semiconductor integrated circuit according to claim 4, wherein the match amplifier starts sensing a potential of the at least one of the first and the second match line on equalization by the equalizer circuit.

6. The semiconductor integrated circuit according to claim 1, further comprising:
    a first and a second match amplifier coupled to the first and the second match line, respectively, wherein
    when comparing the entry data and the search data, the first and the second match amplifier starts sensing a potential of the first and the second match line after equalization by the equalizer circuit.

7. The semiconductor integrated circuit according to claim 1, wherein the memory cell array further includes:
    a third memory cell containing a third part of the entry data;
    a third match line coupled to the third memory cell and, and coupled to a third precharge circuit which precharges the third match line to one of the first and the second potential; and
    a third search line carrying a third part of the search data and being coupled to the third memory cell,
    wherein the third memory cell includes a third comparator circuit comparing the third part of the search data supplied through the third search line and the third part of the entry data; and
    wherein the third match line is coupled to the first match line through a second equalizer circuit.

8. The semiconductor integrated circuit according to claim 7, further comprises a match amplifier coupled to at least one of the second and the third match line.

9. The semiconductor integrated circuit according to claim 7, further comprising:

a first, a second and a third match amplifier coupled to the first and the second match line, respectively, wherein when comparing the entry data and the search data, the first, the second and the third match amplifier starts sensing a potential of the first, the second and the third match line after equalization by the equalizer circuit.

10. The semiconductor integrated circuit according to claim 1, wherein the first part of entry data and the second part of entry data are included in a piece of entry data.

* * * * *